United States Patent
Rao et al.

(10) Patent No.: US 6,184,748 B1
(45) Date of Patent: Feb. 6, 2001

(54) MAGNITUDE AND GROUP DELAY SHAPING CIRCUIT IN CONTINUOUS-TIME READ CHANNEL FILTERS

(75) Inventors: Narendra M. K. Rao; Vishnu Balan, both of San Jose, CA (US)

(73) Assignee: LSI Logic Corporation, Milpitas, CA (US)

( * ) Notice: Under 35 U.S.C. 154(b), the term of this patent shall be extended for 0 days.

(21) Appl. No.: 09/388,996

(22) Filed: Sep. 1, 1999

Related U.S. Application Data

(60) Provisional application No. 60/102,524, filed on Sep. 30, 1998.

(51) Int. Cl.[7] .................................................. H04B 1/10
(52) U.S. Cl. ........................................... 327/552; 327/553
(58) Field of Search .................................. 327/551, 552, 327/553, 557, 558, 559, 103

(56) References Cited

U.S. PATENT DOCUMENTS

| | | | |
|---|---|---|---|
| 5,357,208 | 10/1994 | Nelson | 330/126 |
| 5,525,928 * | 6/1996 | Asakawa | 327/552 |
| 5,736,909 | 4/1998 | Hauser et al. | 333/166 |
| 5,812,009 | 9/1998 | Matsuura | 327/362 |
| 5,898,532 | 4/1999 | Du et al. | 360/46 |
| 6,069,522 * | 5/2000 | Venkatraman et al. | 327/552 |

OTHER PUBLICATIONS

Cideciyan, Roy D.; Dolivo, Francois; Hermann, Reto; Hirt, Walter, "A PRML System for Digital Magnetic Recording", Jan. 1, 1992, IEEE Journal on Selected Areas in Communications.

* cited by examiner

Primary Examiner—Tuan T. Lam

(57) ABSTRACT

A low power, high performance circuit for magnitude and group delay shaping in continuous-time read channel filters is disclosed. The circuit generally comprises a first and a second biquadratic circuit, each having an input, a band pass, and a output low pass node, where the second biquadratic input node is coupled to the first biquadratic output node, and a first and second transconductor coupled to the first biquadratic band pass node and also to the second biquadratic band pass and low pass output nodes, respectively. The first and second transconductors are preferably programmable transconductors.

21 Claims, 3 Drawing Sheets

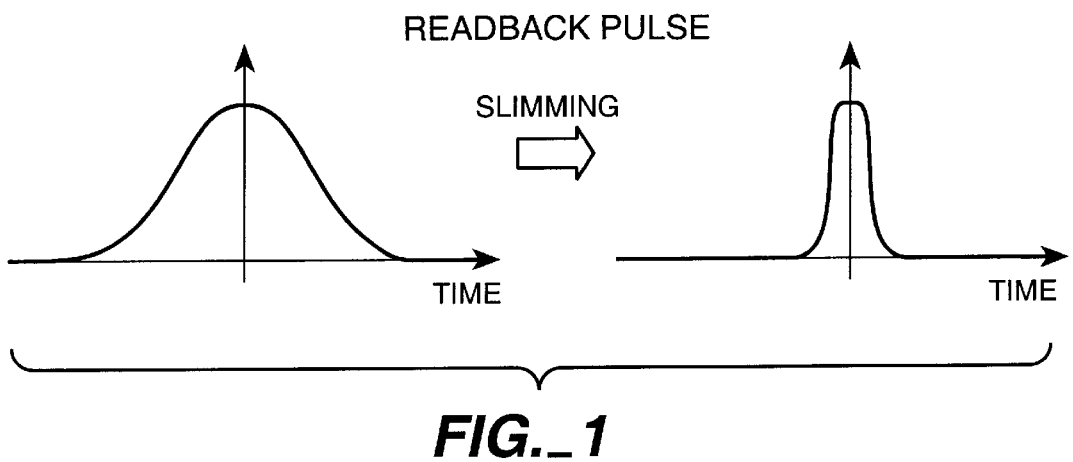
FIG._1
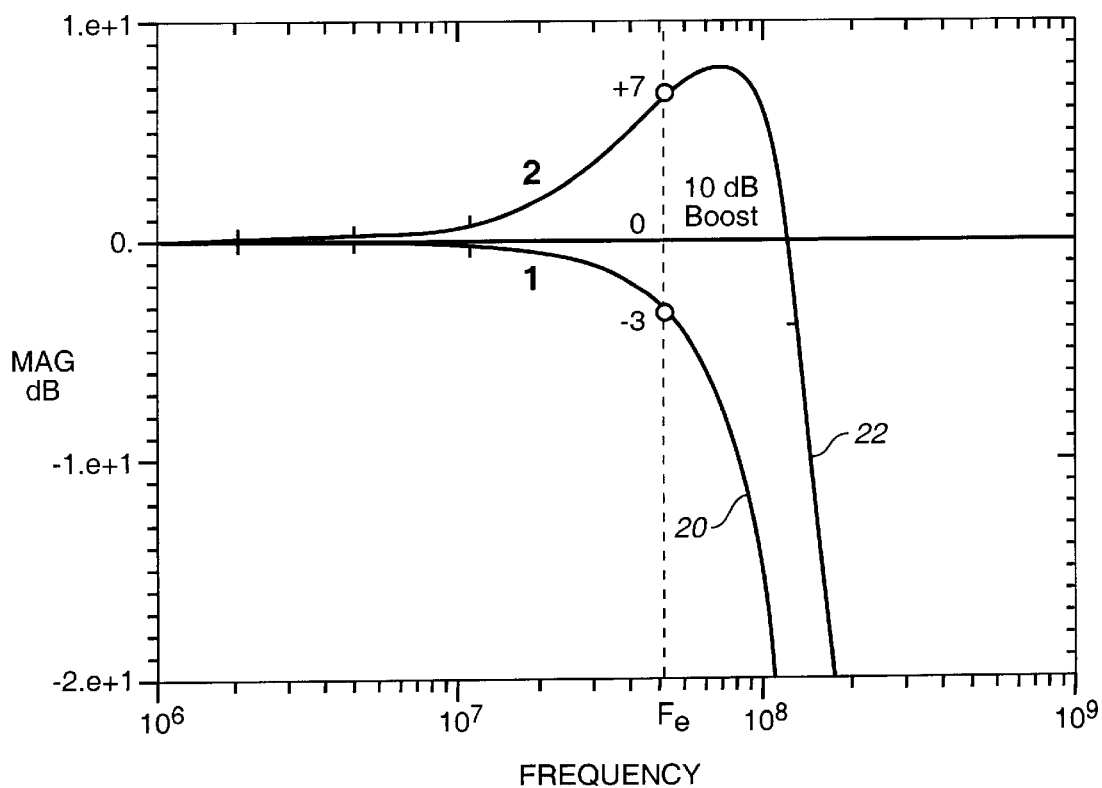
FIG._2

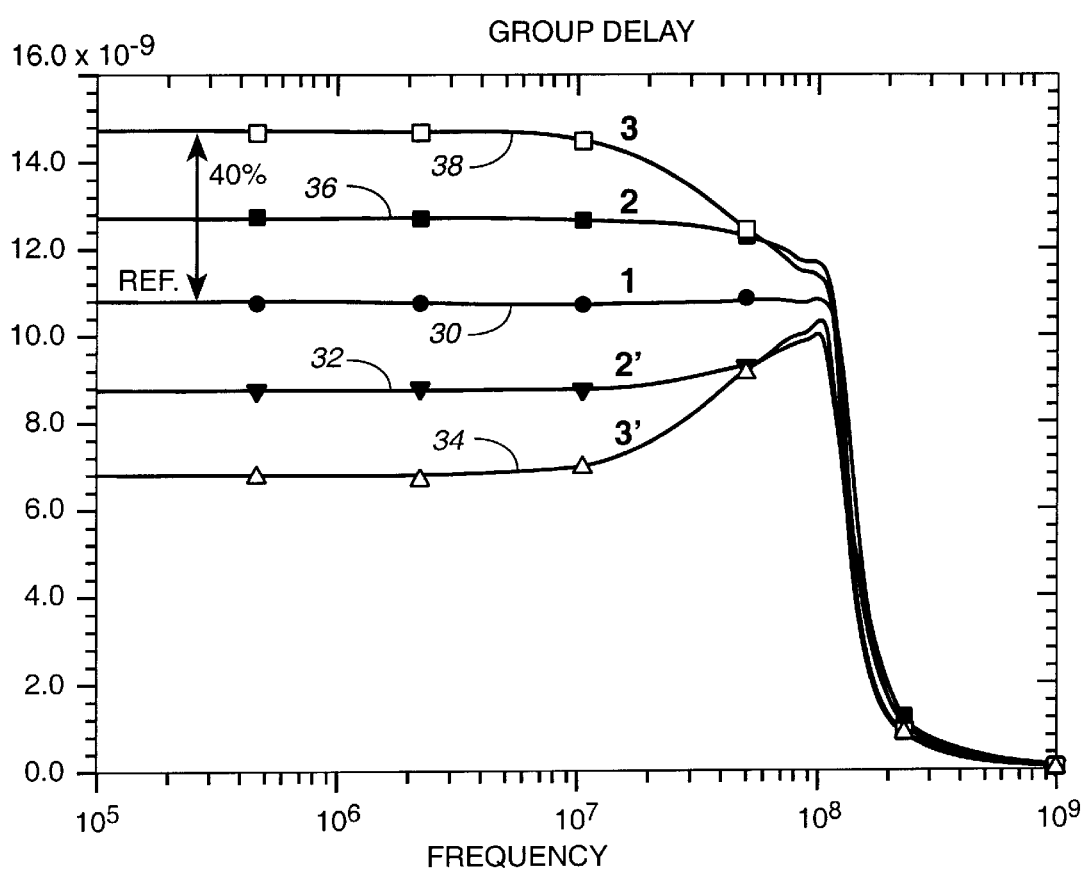
FIG._3

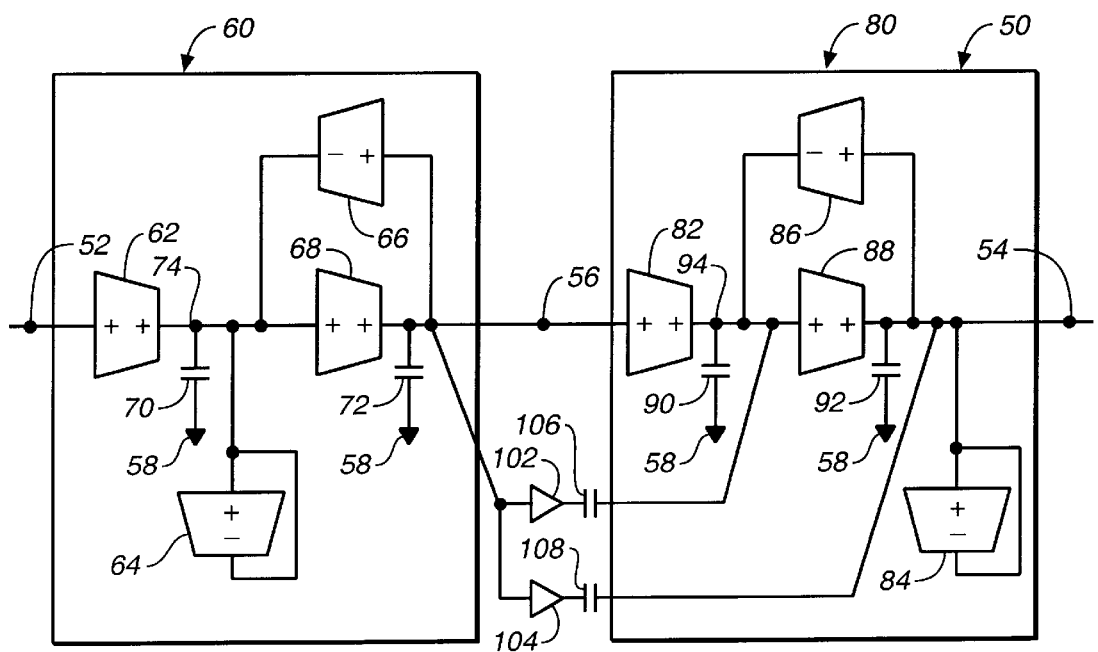
*FIG._4*
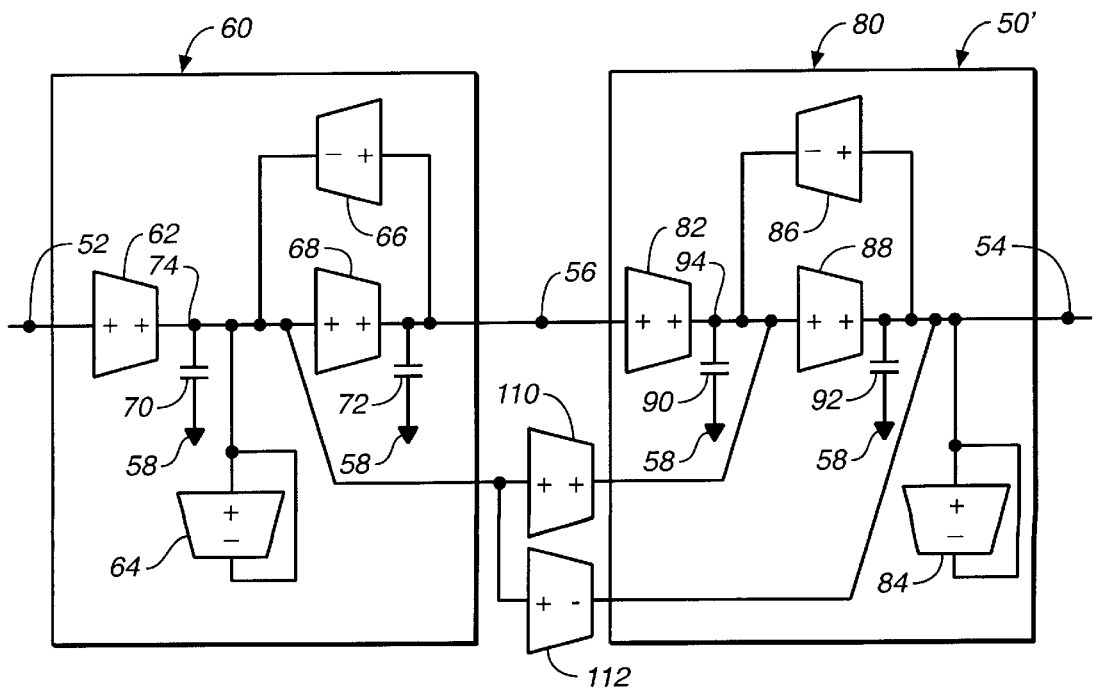
*FIG._5*

MAGNITUDE AND GROUP DELAY SHAPING CIRCUIT IN CONTINUOUS-TIME READ CHANNEL FILTERS

CROSS REFERENCE TO RELATED APPLICATIONS

This application claims priority to U.S. Provisional Patent Application Ser. No. 60/102,524 filed on Sep. 30, 1998, which is incorporated herein by reference in its entirety.

BACKGROUND OF THE INVENTION

1. Field of the Invention

The present invention relates generally to analog integrated circuits. More specifically, a low power, high performance circuit for magnitude and group delay shaping in continuous-time read channel filters is disclosed.

2. Description of Related Art

High-frequency continuous-time filters are primarily used in mixed-signal integrated circuits for anti-aliasing and reconstruction functions. In hard disk drive applications, continuous-time filters, also referred to as read channel filters, provide channel equalization via magnitude and group delay shaping. Equalization in analog domain is advantageous in terms of power, die size, reduced clock latency and optimized dynamic range for the analog-to-digital converter, while equalization in digital domain offers programmability and architectural flexibility. Current state of the art read channel filters realize seventh order linear phase responses to provide up to 13 dB of magnitude boost, i.e., increase in magnitude without a change in phase, and approximately 30% group delay shaping for a maximum unboosted filter cut-off frequency $F_c$ of about 70 MHz to support data rates of up to 250 Mbps.

Filter magnitude and group delay shaping are important functions in continuous time filters, such as in read signal equalization, video signal conditioning, cable equalizers, etc. Specifically, in disk-drive applications, the readback signal has traditionally been pulse slimmed in time domain in order to mitigate the undesirable effects of intersymbol interference, a phenomenon that occurs due to close spacing of adjacent bits. FIG. 1 shows a readback signal with and without pulse slimming in the time domain. Pulse slimming is generally equivalent to accentuating the mid-to-high frequency region of the read pulse spectrum, or a magnitude boost in an appropriate frequency band. Pulse slimming should not distort the group delay and hence the boost is also referred to as symmetric boost.

In the frequency domain, pulse slimming is equivalent to shaping the magnitude as a function of frequency. FIG. 2 shows a readback signal with and without pulse slimming in the frequency domain. Specifically, curve 20 represents a traditional unboosted low pass response and curve 22 represents a boosted magnitude which is well defined as a function of frequency.

Although the problem of intersymbol interference ("ISI") has been exacerbated in high density and high speed disk-drives, the availability of powerful digital signal processing ("DSP") techniques enable the detection of readback signals reliably and efficiently. However, this detection process typically demands increasing amounts of boost, exceeding 13 dB relative to the unboosted value at the lowpass corner frequency.

In addition to magnitude shaping, the phase response or group delay of the readback signal is optionally conditioned to compensate for the nonlinear phase responses, of circuits, caused by finite bandwidth and DC offset-cancellation needs. Group delay shaping, also referred to as asymmetric boost, is different from magnitude shaping or symmetric boost. FIG. 3 shows effects of modifying the group delay as a function of frequency when compared to a nominally flat group delay of the read channel filter. Specifically, curve 30 shows a nominally flat group delay of the read channel filter while curves 32, 34, 36, and 38 show the effects of modifying the group delay to various extents as a function of frequency. As is evident from the graph of FIG. 3, with data rates increasing to 1 Gbps, as much as 40% of the group delay compensation may be required.

Increases in the hard disk drive data rates increase the user bit density, which in turn imposes more stringent requirements on magnitude and group delay equalization. Thus, a circuit that is both power and die-area efficient to achieve magnitude and group delay shaping for high data rate read channel filters is highly desired.

SUMMARY OF THE INVENTION

A low power, high performance circuit for magnitude and group delay shaping in continuous-time read channel filters is disclosed. It should be appreciated that the present invention can be implemented in numerous ways, including as a process, an apparatus, a system, a device, or a method. Several inventive embodiments of the present invention are described below.

The magnitude and group delay shaping circuit generally comprises a first and a second biquadratic circuit, each having an input, a band pass, and an output low pass node, where the second biquadratic input node is coupled to the first biquadratic output low pass node, and first and second transconductors coupled to the first biquadratic band pass node and also to the second biquadratic band pass and low pass output nodes, respectively. The first and second transconductors are preferably programmable transconductors.

In a preferred embodiment, the first and second biquadratic circuits are unboosted and boosted biquadratic circuits, respectively. Each of the first and second biquadratic circuits optionally includes a plurality of transconductors. The first biquadratic transconductor is coupled to the first biquadratic band pass node and at least one of which is further coupled to one of the first biquadratic input node and output low pass nodes. Each of the second biquadratic transconductors is coupled to at least one of the second biquadratic band pass, low pass output, and input nodes. Each of the first and second biquadratic circuits may further include a band pass and a low pass capacitor, coupled to the band pass and low pass nodes, respectively, of the corresponding biquadratic circuit.

In another embodiment, a method for providing magnitude boost and group delay shaping comprises providing a first and a second biquadratic circuit each having an input, a band pass, and an output low pass node, where the second biquadratic input node is coupled to the first biquadratic output node, and selecting a first and second transconductance of a first and a second transconductor, respectively, where the first and second transconductors are coupled to the first biquadratic band pass node and also to the second biquadratic band pass and low pass output nodes, respectively.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 1 shows a readback signal with and without pulse slimming in the time domain;

FIG. 2 shows a readback signal with and without pulse slimming in the frequency domain;

FIG. 3 shows effects of modifying the group delay as a function of frequency when compared to a nominally flat group delay of the read channel filter;

FIG. 4 is a diagram of a typical magnitude boost and group delay shaping circuit; and FIG. 5 is a diagram of an example of an improved magnitude boost and group delay shaping circuit for providing greater frequency range and boost.

DESCRIPTION OF SPECIFIC EMBODIMENTS

A low power, high performance circuit for magnitude and group delay shaping in continuous-time read channel filters is disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

In read channel filters, magnitude and group delay shaping are provided by the addition of two zeros to the basic transfer function that is used for anti-aliasing and noise filtering purposes. The two zeros are preferably described by a Laplace numerator transfer function N(s):

$$N(s)=[1+K_1*(s/\omega_1)-K_2*(s^2/\omega_1^2)]$$

where coefficients $K_1$ and $K_2$ control the amount of group delay and magnitude shaping, respectively, and where $\omega_1$ represents the characteristic frequency. The interaction between magnitude and group delay shaping is small because magnitude shaping is more pronounced at high frequencies while group delay shaping is pronounced at lower frequencies. Thus, generally speaking, the coefficients $K_1$ and $K_2$ are utilized to independently control group delay shaping and magnitude shaping, respectively.

Traditionally, the numerator transfer function N(s) is realized by modifying the standard biquadratic ("biquad") structure. Biquadratic refers to a general transfer function that comprises quadratic functions both in the numerator and in the denominator.

FIG. 4 is a diagram of an example of a standard magnitude boost and group delay shaping circuit 50. The circuit 50 generally comprises a first biquadratic circuit or first biquad 60 and a second biquadratic circuit or second biquad 80. The first biquad 60 is a standard unboosted structure while the second biquad 80 is a standard boosted structure.

Although not shown, an input node 52 and an output node 54 of the magnitude boost and group delay shaping circuit 50 are optionally coupled to a variable gain amplifier or a preamplifier and an analog-to-digital converter, respectively. The output node 54 also serves as a low pass node of the second biquad 80. An intermediate node 56 serves as an output node and a low pass node of the first biquad 60 as well as an input node of the second biquad 80.

The first biquad 60 includes a plurality of transconductors 62, 64, 66, 68 and capacitors 70, 72, each coupled to a band pass node 74, the input node 52, the first biquad low pass node 56, and/or a ground 58. Each of the transconductors 62, 64, 66, 68 is coupled to the band pass node 74. Transconductor 62 is further coupled to the input node 52 while transconductors 66, 68 are both further coupled to the first biquad low pass node 56. Transconductors 66, 68 are coupled in a feedback loop between the first biquad low pass node 56 and the band pass node 74. Transconductor 64 is coupled in a feedback loop to itself and to the band pass node 74. Capacitor 70 is coupled between the band pass node 74 and ground 58 while capacitor 72 is coupled between the low pass node 56 and the ground 58.

The second biquad 80 similarly includes a plurality of transconductors 82, 84, 86, 88 and capacitors 90, 92, each coupled to a band pass node 94, the second biquad input node 56, the second biquad low pass node 54, and/or the ground 58. Each of the transconductors 82, 86, 88 is coupled to the band pass node 94. Transconductor 82 is further coupled to the second biquad input node 56 while transconductors 86, 88 are both further coupled to the second biquad low pass node 54. Transconductor 84 is coupled in a feedback loop to itself and to the second biquad low pass node 54. Capacitor 90 is coupled between the band pass node 94 and ground 58 while capacitor 92 is coupled between the second biquad low pass node 54 and ground 58. First and second biquad band pass nodes 94, 74 and first and second biquad low pass nodes 54, 56 may also be referred to as integrating nodes.

The magnitude boost and group delay shaping circuit 50 further includes programmable voltage amplifiers 102, 104 and capacitors 106, 108 coupled between the first and second biquads 60, 80. Each of the programmable voltage amplifiers 102, 104 is coupled to the first biquad low pass node 56 and to the capacitors 106, 108, respectively. The capacitors 106, 108 in turn are coupled to the band pass node 94 and the second biquad low pass node 54, respectively. The voltage amplifiers 102, 104 are programmable to have amplification values corresponding to the coefficients $K_1$ and $K_2$ of the numerator transfer N(s) to control the amount of group delay and magnitude shaping.

Capacitors 90, 106 form a first integrating capacitor and capacitors 92, 108 form a second integrating capacitor. Each of the filter capacitors is split into two components such that capacitors 106, 108 provide transmission zeroes. Additionally, the programmable voltage amplifiers 102 and 104 are provided to control the amount of group delay and magnitude shaping, respectively.

As shown, transconductors 62, 68 of the first biquad 60 and transconductors 82, 88 of the second biquad 80 are designated with "++" while transconductors 64, 66 of the first biquad 60 and transconductors 84, 86 of the second biquad 80 are designated with "+−". In general, the input and output of a transconductor with "++" designation are in phase while the input and output of a transconductor with "+−" designation are out of phase, or vice versa.

The magnitude boost and group delay shaping circuit 50 works relatively well at low frequencies and for moderate degrees of shaping. However, for high data rates, the frequency of operation increases and it is difficult to design the circuit 50 to achieve the higher boost with the capacitive loads of capacitors 106, 108. In addition, the finite bandwidth and non-zero output resistance and capacitance of the programmable voltage amplifiers 102, 104 contribute significantly to group delay distortion. These two factors limit the frequency range and the amount of boost that can be achieved.

FIG. 5 is a diagram of an example of an improved magnitude boost and group delay shaping circuit 50' for providing a greater frequency range and boost when compared to the circuit 50 of FIG. 4. The magnitude boost and group delay shaping circuit 50' similarly comprises the first biquad 60 and the second biquad 80. However, coupled to the two biquads 60, 80 of the circuit 50' are programmable transconductors 110, 112, rather than the programmable voltage amplifiers 102, 104 and capacitors 106, 108. In addition, the programmable transconductors 110, 112 of the circuit 50' utilize signals internal to the first biquad 60 as opposed the intermediate node 56 as is the case with circuit 50 shown in FIG. 4.

In the circuit 50', the realization of the numerator transfer function N(s) is distributed over both biquads 60, 80. The transconductor 68 and the capacitor 72 provide an integration of the voltage on node 74. Thus, by taking the signal at the first biquad band pass node 74 rather than the first biquad low pass node 56, the integration function followed by a subsequent differentiation function are bypassed such that the need for capacitors between the first and second biquads 60, 80, e.g., capacitors 106, 108 in FIG. 4, is eliminated. Accordingly, such configuration results in a simpler implementation of the numerator function N(s).

Referring again to FIG. 5, the first biquad 60 is such that the transfer function $[V_{56}(s)/V_{74}(s)]$ is an undamped integrator function, where $V_{56}(s)$ and $V_{74}(s)$ are the signals at nodes 56 and 74, respectively. This features allows the realization of the numerator function N(s) by generating currents proportional to the signal $V_{74}(s)$ at the first biquad band pass node 74 and adding those currents to the integrating nodes 94, 54 in the second biquad 80 as shown.

Programmable transconductors 110, 112 provide independent control of magnitude boost and group delay shaping, respectively. In particular, transconductors 110, 112 are programmable to have transconductances corresponding to the coefficients $K_1$ and $K_2$ of the numerator N(s) to control the amount of group delay and magnitude shaping.

Utilizing programmable transconductors 110, 112 in the biquadratic magnitude boost and group delay shaping circuit 50' of FIG. 5 provide several advantages over the circuit 50 of FIG. 4. For example, because the programmable transconductors 110, 112 of the circuit 50' are similarly fabricated as the other filter transconductors, e.g., transconductors 62, 64, 66, 68, 82, 84, 86, 88, providing programmable transconductors 110, 112 facilitate in tracking the filter process and temperature variations as desired.

Further, the non-ideal output resistances and capacitances of the programmable transconductor 110 are absorbed at the second biquad integrating node or band pass node 94 while the non-ideal output resistances and capacitances of the programmable transconductor 112 are absorbed at the second biquad integrating node or lowpass node 54. In particular, the non-ideal output capacitances of the programmable transconductors 110, 112 are absorbed by the capacitors 90, 92 at the second biquad integrating nodes 94, 54, respectively. In addition, because the feedback loop of the transconductor 86 has resistive properties and because the transconductor 84 acts like a resistor coupled to ground, the non-ideal output resistances of the programmable transconductors 110, 112 are absorbed by the parasitic resistances of the transconductors 86, 84 at the second biquad integrating nodes 94, 54, respectively. Because of the absorption of the non-ideal output resistances and capacitances of the programmable transconductors 110, 112, the programmable transconductors 110, 112 generally do not contribute to phase shift or group delay distortion.

The transconductor configuration of the circuit 50' of FIG. 5 provides as much as 20% savings in die size and power when compared to the circuit 50 of FIG. 4. Also, as described above, the parasitic capacitances and resistances are generally equalized in circuit 50' at all the integrating nodes 74, 56, 94, 54.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A magnitude boost and group delay shaping circuit, comprising:
   a first biquadratic circuit having an input node, a first biquadratic band pass node, and a first biquadratic output low pass node;
   a second boosted biquadratic circuit having a second biquadratic band pass node, a second biquadratic low pass output node, and an input node coupled to said first biquadratic output low pass node;
   a first transconductor coupled between said first biquadratic band pass node and said second biquadratic band pass node; and
   a second transconductor coupled between said first biquadratic band pass node and said second biquadratic low pass output node.

2. The magnitude boost and group delay shaping circuit of claim 1, wherein said first and second transconductors are programmable transconductors.

3. The magnitude boost and group delay shaping circuit of claim 1, wherein one of said first and second transconductors has input and output that are in phase and another of said first and second transconductors has input and output that are out of phase.

4. The magnitude boost and group delay shaping circuit of claim 1, wherein said first biquadratic circuit is an unboosted biquadratic circuit.

5. The magnitude boost and group delay shaping circuit of claim 1, wherein said second biquadratic circuit is a boosted biquadratic circuit.

6. The magnitude boost and group delay shaping circuit of claim 1, wherein said first biquadratic circuit comprises a plurality of transconductors each coupled to said first biquadratic band pass node, at least one of said first biquadratic transconductors further coupled to one of said first biquadratic input node and said first biquadratic output low pass node.

7. The magnitude boost and group delay shaping circuit of claim 6, wherein said first biquadratic circuit further comprises a first biquadratic band pass capacitor coupled to said first biquadratic band pass node and a first biquadratic low pass capacitor coupled to said first biquadratic low pass node.

8. The magnitude boost and group delay shaping circuit of claim 6, wherein said first biquadratic transconductors include at least two feedback transconductors coupled between the first biquadratic band pass node and the first biquadratic low pass node.

9. The magnitude boost and group delay shaping circuit of claim 8, wherein one of said first biquadratic feedback transconductors has input and output that are in phase and another of said first biquadratic feedback transconductors has input and output that are out of phase.

10. The magnitude boost and group delay shaping circuit of claim 1, wherein said second biquadratic circuit comprises a plurality of transconductors each coupled to at least one of said second biquadratic band pass, low pass output, and input nodes.

11. The magnitude boost and group delay shaping circuit of claim 10, wherein said second biquadratic circuit further comprises a second biquadratic band pass capacitor coupled to said second biquadratic band pass node and a second biquadratic low pass capacitor coupled to said second biquadratic low pass node.

12. The magnitude boost and group delay shaping circuit of claim 10, wherein said second biquadratic transconductors include at least two feedback transconductors coupled between the second biquadratic band pass node and the second biquadratic low pass node.

13. The magnitude boost and group delay shaping circuit of claim 12, wherein one of said second biquadratic feedback transconductors has input and output that are in phase and another of said second biquadratic feedback transconductors has input and output that are out of phase.

14. A method for providing magnitude boost and group delay shaping, comprising:

providing a first biquadratic circuit having a first biquadratic input, band pass, and output low pass nodes;

providing a second biquadratic circuit having a second biquadratic input, band pass, low pass output nodes, the second biquadratic input node coupled to the first biquadratic output low pass node;

selecting a first transconductance of a first transconductor coupled between said first biquadratic band pass node and said second biquadratic band pass node; and selecting a second transconductance of a second transconductor coupled between said first biquadratic band pass node and said second biquadratic low pass output node.

15. The method for providing magnitude boost and group delay shaping of claim 14, wherein said first transconductance corresponds to a group delay shaping level.

16. The method for providing magnitude boost and group delay shaping of claim 14, wherein said second transconductance corresponds to a magnitude boost level.

17. The method for providing magnitude boost and group delay shaping of claim 14, wherein first and second first transconductors are programmable transconductors.

18. The method for providing magnitude boost and group delay shaping of claim 14, wherein said first biquadratic circuit is an unboosted biquadratic circuit.

19. The method for providing magnitude boost and group delay shaping of claim 14, wherein said second biquadratic circuit is a boosted biquadratic circuit.

20. The method for providing magnitude boost and group delay shaping of claim 14, wherein said providing the first biquadratic circuit includes providing a plurality of transconductors each coupled to said first biquadratic band pass node, at least one of said first biquadratic transconductors further coupled to one of said first biquadratic input node and said first biquadratic output low pass node.

21. The method for providing magnitude boost and group delay shaping of claim 14, wherein said providing the second biquadratic circuit includes providing a plurality of transconductors each coupled to at least one of said second biquadratic band pass, low pass output, and input nodes.

* * * * *